(12) United States Patent
Fujikawa et al.

(10) Patent No.: US 8,895,333 B2
(45) Date of Patent: *Nov. 25, 2014

(54) METHOD FOR MANUFACTURING SEMICONDUCTOR DEVICE WITH PIXEL ELECTRODE OVER GATE ELECTRODE OF THIN FILM TRANSISTOR

(75) Inventors: Saishi Fujikawa, Kanagawa (JP); Yoko Chiba, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/603,469

(22) Filed: Sep. 5, 2012

(65) Prior Publication Data

US 2012/0329186 A1 Dec. 27, 2012

Related U.S. Application Data

(62) Division of application No. 12/325,584, filed on Dec. 1, 2008, now Pat. No. 8,268,654.

(30) Foreign Application Priority Data

Dec. 3, 2007 (JP) .................................. 2007-312900

(51) Int. Cl.
*H01L 21/336* (2006.01)
*H01L 33/08* (2010.01)
*H01L 27/12* (2006.01)

(52) U.S. Cl.
CPC ........ *H01L 27/1214* (2013.01); *H01L 27/1288* (2013.01)
USPC ........................................... 438/30; 438/158

(58) Field of Classification Search
CPC ............................ H01L 21/336; H01L 33/08
USPC .............. 438/30, 158; 257/E21.411, E33.053
See application file for complete search history.

(56) References Cited

U.S. PATENT DOCUMENTS 4,409,134 A 10/1983 Yamazaki
RE34,658 E 7/1994 Yamazaki et al.
(Continued)

FOREIGN PATENT DOCUMENTS

JP 03-011744 A 1/1991
JP 10-341021 A 12/1998
(Continued)

OTHER PUBLICATIONS

C.W. Kim et al.; "42.1: A Novel Four-Mask-Count Process Architecture for TFT-LCDs"; SID '00 Digest; pp. 1006-1009; 2000.

(Continued)

*Primary Examiner* — Walter H Swanson
(74) *Attorney, Agent, or Firm* — Fish & Richardson P.C.

(57) ABSTRACT

The number of photomasks is reduced in a method for manufacturing a liquid crystal display device which operates in a fringe field switching mode, whereby a manufacturing process is simplified and manufacturing cost is reduced. A first transparent conductive film and a first metal film are sequentially stacked over a light-transmitting insulating substrate; the first transparent conductive film and the first metal film are shaped using a multi-tone mask which is a first photomask; an insulating film, a first semiconductor film, a second semiconductor film, and a second metal film are sequentially stacked; the second metal film and the second semiconductor film are shaped using a multi-tone mask which is a second photomask; a protective film is formed; the protective film is shaped using a third photomask; a second transparent conductive film is formed; and the second transparent conductive film is shaped using a fourth photomask.

31 Claims, 9 Drawing Sheets

(56) References Cited

U.S. PATENT DOCUMENTS

| | | | |
|---|---|---|---|
| 6,008,065 | A | 12/1999 | Lee et al. |
| 6,468,840 | B2 | 10/2002 | Tanaka et al. |
| 6,485,997 | B2 | 11/2002 | Lee et al. |
| 6,493,048 | B1 | 12/2002 | Baek et al. |
| 6,623,653 | B2 | 9/2003 | Furuta et al. |
| 6,635,581 | B2 | 10/2003 | Wong |
| 6,773,941 | B2 | 8/2004 | French et al. |
| 6,778,232 | B2 | 8/2004 | Nakata et al. |
| 7,023,021 | B2 | 4/2006 | Yamazaki et al. |
| 7,223,643 | B2 | 5/2007 | Ohnuma et al. |
| 7,315,344 | B2 | 1/2008 | Lim |
| 7,517,464 | B2 | 4/2009 | Matsushita et al. |
| 7,520,245 | B2 | 4/2009 | Ohmi et al. |
| 7,541,229 | B2 | 6/2009 | Gan et al. |
| 7,550,327 | B2 | 6/2009 | Lee et al. |
| 7,588,970 | B2 | 9/2009 | Ohnuma et al. |
| 7,599,014 | B2 | 10/2009 | Shih |
| 7,608,490 | B2 | 10/2009 | Yamazaki et al. |
| 7,622,336 | B2 | 11/2009 | Ohnuma |
| 7,738,050 | B2 | 6/2010 | Yamazaki et al. |
| 8,420,413 | B2 * | 4/2013 | Lin et al. .................. 438/22 |
| 2004/0043545 | A1 * | 3/2004 | Yoo et al. .................. 438/149 |
| 2004/0134878 | A1 | 7/2004 | Matsushita et al. |
| 2006/0024866 | A1 | 2/2006 | Gan et al. |
| 2006/0146255 | A1 | 7/2006 | Ahn |
| 2006/0240602 | A1 | 10/2006 | Roca et al. |
| 2006/0256268 | A1 | 11/2006 | Jeong et al. |
| 2006/0290867 | A1 | 12/2006 | Ahn et al. |
| 2007/0001225 | A1 | 1/2007 | Ohnuma et al. |
| 2007/0002249 | A1 | 1/2007 | Yoo et al. |
| 2007/0002372 | A1 | 1/2007 | Sekizawa |
| 2007/0023790 | A1 | 2/2007 | Ohnuma et al. |
| 2007/0037070 | A1 | 2/2007 | Ohnuma et al. |
| 2007/0059855 | A1 | 3/2007 | Shih |
| 2007/0085475 | A1 | 4/2007 | Kuwabara et al. |
| 2007/0126968 | A1 | 6/2007 | Uochi |
| 2007/0126969 | A1 | 6/2007 | Kimura et al. |
| 2007/0139571 | A1 | 6/2007 | Kimura |
| 2007/0146591 | A1 | 6/2007 | Kimura et al. |
| 2007/0146592 | A1 | 6/2007 | Kimura |
| 2007/0236640 | A1 | 10/2007 | Kimura |
| 2007/0284627 | A1 | 12/2007 | Kimura |
| 2008/0002079 | A1 | 1/2008 | Kimura |
| 2008/0116474 | A1 | 5/2008 | Choung et al. |
| 2008/0136990 | A1 | 6/2008 | Kimura |
| 2008/0143903 | A1 | 6/2008 | Ahn |
| 2008/0210942 | A1 * | 9/2008 | Yang .................. 257/59 |
| 2008/0299689 | A1 | 12/2008 | Yamazaki |
| 2008/0308807 | A1 | 12/2008 | Yamazaki et al. |
| 2009/0001375 | A1 | 1/2009 | Yamazaki et al. |
| 2009/0002591 | A1 | 1/2009 | Yamazaki et al. |
| 2009/0008645 | A1 | 1/2009 | Yamazaki et al. |
| 2009/0101906 | A1 | 4/2009 | Hosoya et al. |
| 2009/0104723 | A1 | 4/2009 | Hosoya et al. |
| 2009/0111198 | A1 | 4/2009 | Fujikawa et al. |
| 2009/0117691 | A1 | 5/2009 | Fujikawa et al. |
| 2009/0148970 | A1 | 6/2009 | Hosoya et al. |
| 2009/0261334 | A1 | 10/2009 | Ahn |
| 2009/0284676 | A1 | 11/2009 | Ahn et al. |

FOREIGN PATENT DOCUMENTS

| | | |
|---|---|---|
| JP | 2001-235763 A | 8/2001 |
| JP | 2004-177946 A | 6/2004 |
| KR | 2007-0070718 A | 7/2007 |
| KR | 2007-0076620 A | 7/2007 |

OTHER PUBLICATIONS

Chinese Office Action (Chinese Patent Application No. 200810183698.X) mailed Jul. 18, 2012 with English translation, 26 pages.

* cited by examiner

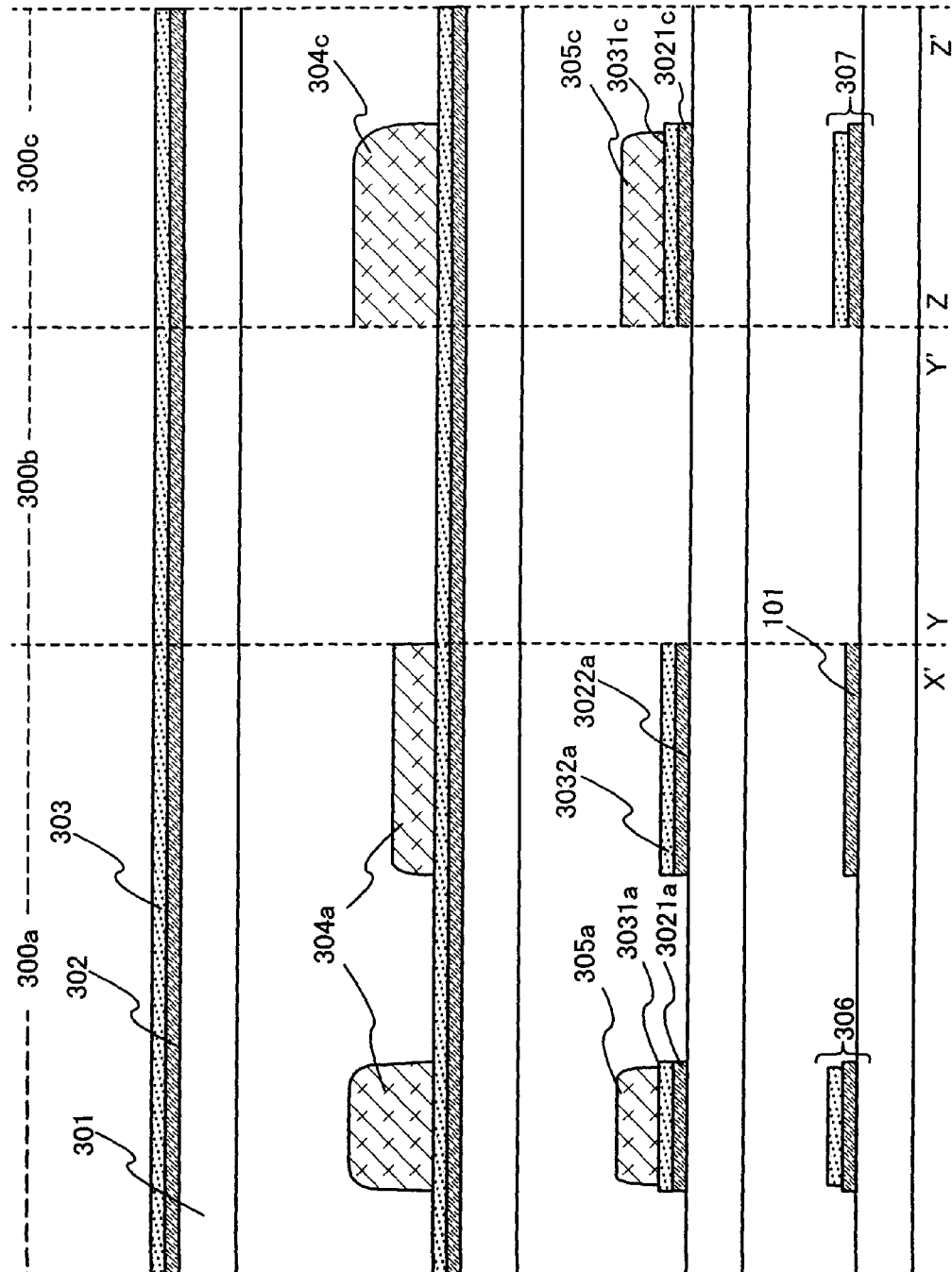

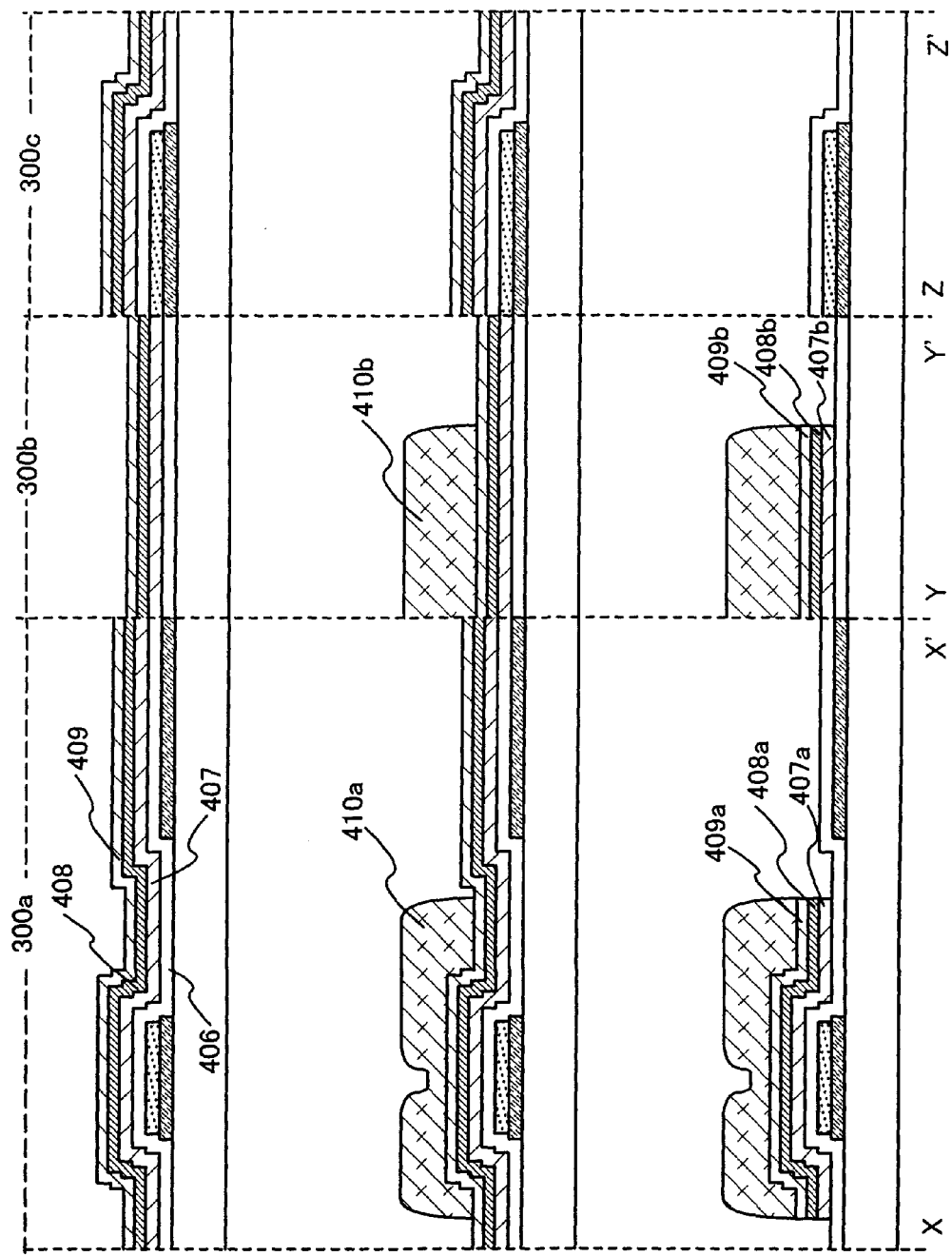

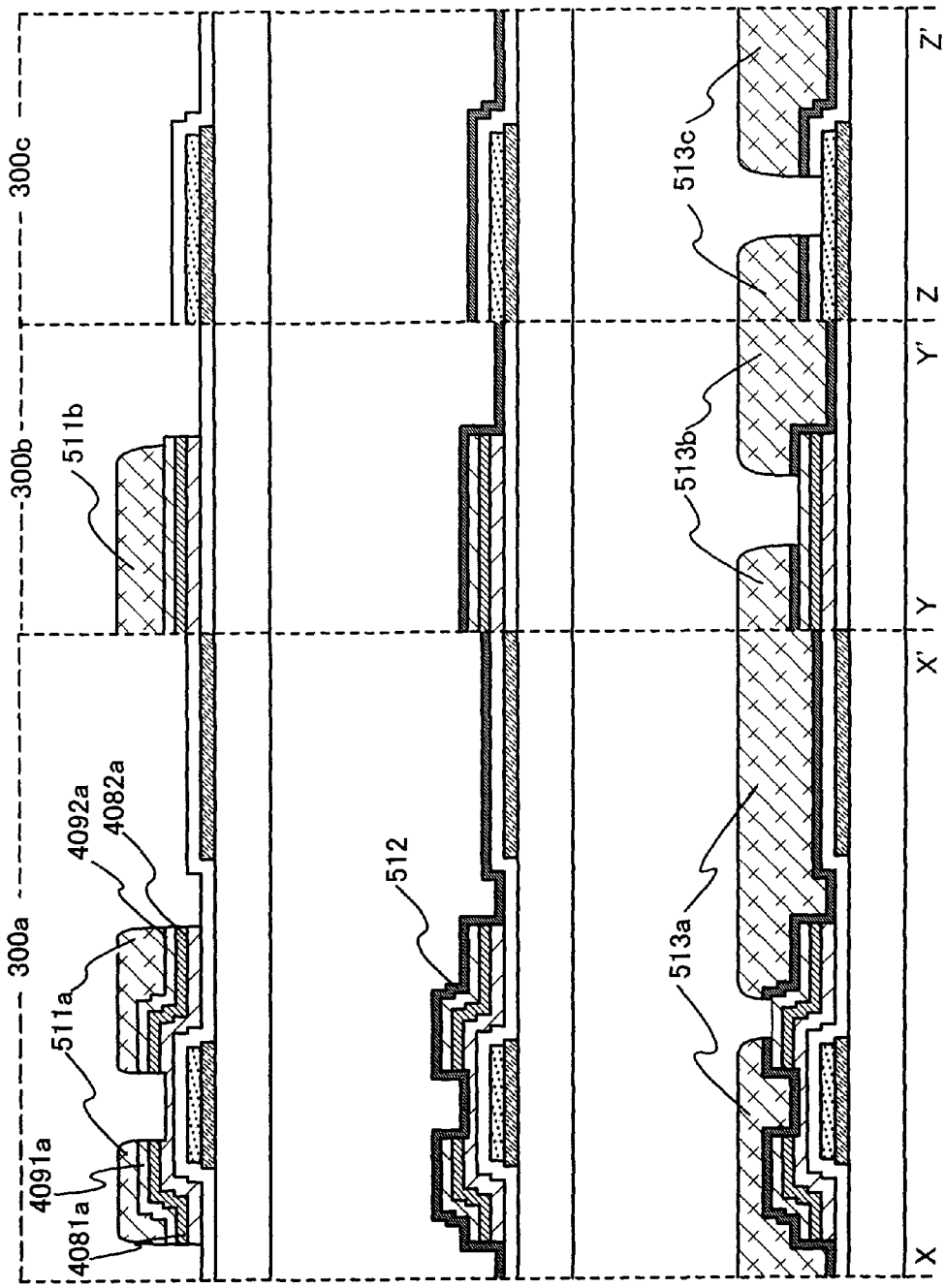

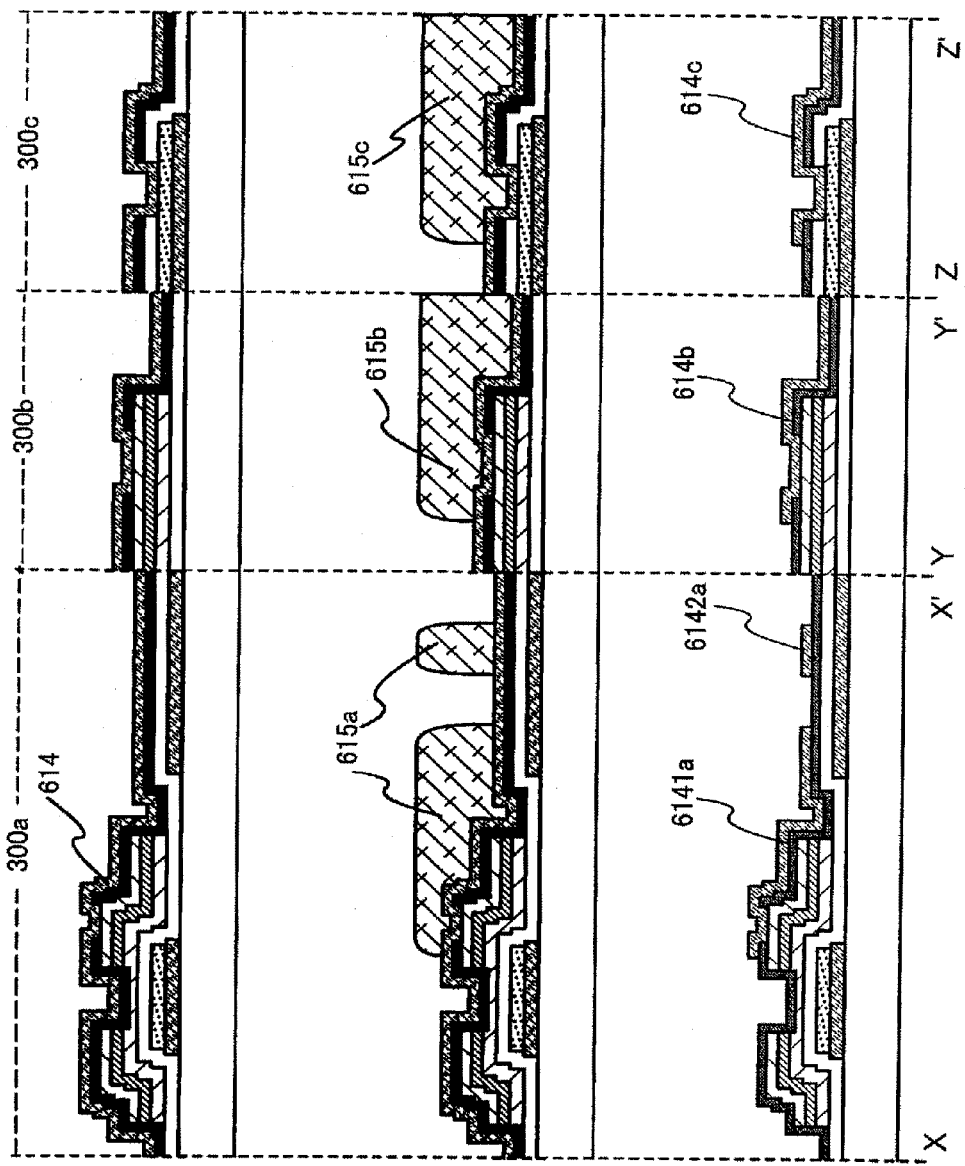

METHOD FOR MANUFACTURING SEMICONDUCTOR DEVICE WITH PIXEL ELECTRODE OVER GATE ELECTRODE OF THIN FILM TRANSISTOR

CROSS-REFERENCE TO RELATED APPLICATIONS

This application is a continuation of U.S. application Ser. No. 12/325,584, filed Dec. 1, 2008, now U.S. Pat. No. 8,268, 654, which claims the benefit of a foreign priority application filed in Japan as Serial No. 2007-312900 on Dec. 3, 2007, both of which are incorporated by reference.

BACKGROUND OF THE INVENTION

1. Field of the Invention

The present invention relates to a semiconductor device which has a circuit including a thin film transistor (hereinafter referred to as a TFT) and a method for manufacturing the semiconductor device.

Note that the term "semiconductor device" in this specification refers to devices in general that can operate by utilizing semiconductor characteristics, and electro-optical devices, semiconductor circuits, and electronic devices are all included in the semiconductor device. Examples thereof include electro-optical devices typified by display devices using liquid crystal and the like, and electronic devices incorporating these electro-optical devices as components.

2. Description of the Related Art

Display devices are widely spread as liquid crystal display televisions, displays for personal computers, cellular phones, and the like, in many of which liquid crystal display devices that include as switching elements thin film transistors using amorphous silicon (hereinafter referred to as amorphous silicon TFTs) are used.

One type of liquid crystal display devices that include amorphous silicon TFTs as switching elements is a fringe field switching (FFS) mode LCD. The FFS mode is a technique for improving aperture ratio and transmittance of in-plane switching (IPS) mode LCDs, details of which are described in Reference 1 (Reference 1: Japanese Published Patent Application No. 2001-235763).

In a conventional amorphous silicon TFT, its stacked structure is formed using six masks by a photolithography step. However, reduction in the number of steps has been desired in order to reduce manufacturing cost or to increase yield.

SUMMARY OF THE INVENTION

Photolithography includes the following steps: application of a photoresist; prebake; a light exposure step using a photomask; a development step; an etching step; a resist stripping step; and the like. In addition to these steps, a large number of steps such as a cleaning step and an inspecting step are included in a single photolithography process.

Conventional manufacture of an amorphous silicon TFT with use of six photomasks requires the photolithography process to be repeated six times. Thus, the photolithography process is a major factor in determination of throughput of a manufacturing process and manufacturing cost. Accordingly, reduction in the number of photomasks means reduction in time needed for manufacture and manufacturing cost and is a major issue in view of mass production.

In order to reduce the number of steps in a conventional six-mask process, the present invention relates to a semiconductor device which is manufactured using four masks and a method for manufacturing the semiconductor device. FIGS. 3A to 3D, FIGS. 4A to 4C, FIGS. 5A to 5C, and FIGS. 6A to 6C show an example of a method for manufacturing a semiconductor device of the present invention. A feature of this manufacturing process is to stack a gate metal over a transparent conductive film, to use a light exposure technique using a half-tone photomask or a gray-tone photomask that is a first multi-tone mask, and to separately form a region where the transparent conductive film is present as a single layer and a region where the stack of the transparent conductive film and the metal film is left without any change. Here, the portion where the transparent conductive film is present as a single layer is an electrode (hereinafter referred to as a common electrode) of an FFS mode LCD.

In addition, a feature of the present invention is to process an amorphous silicon film by a light exposure technique using a half-tone photomask or a gray-tone photomask that is a second multi-tone mask.

With the use of the aforementioned two multi-tone masks, a process using a smaller number of masks than that in a conventional six-mask process is realized.

The present invention can be expected to provide the following effects and the like.

A conventional amorphous silicon TFT is generally manufactured with six masks, whereas the present invention makes it possible to manufacture a TFT with four masks. By employment of a process of the present invention with a smaller number of masks, the number of manufacturing steps can be made smaller than in a conventional process. Thus, time needed for manufacture and manufacturing cost for a semiconductor device can be reduced.

In addition, by reduction in the number of masks compared to that in a conventional process, the number of times of photomask alignment can be reduced, and decrease in yield due to misalignment between photomasks can be suppressed.

BRIEF DESCRIPTION OF THE DRAWINGS

FIGS. 3A to 3D are cross-sectional views illustrating a method for manufacturing a semiconductor device of the present invention.

FIGS. 4A to 4C are cross-sectional views illustrating a method for manufacturing a semiconductor device of the present invention.

FIGS. 5A to 5C are cross-sectional views illustrating a method for manufacturing a semiconductor device of the present invention.

FIGS. 6A to 6C are cross-sectional views illustrating a method for manufacturing a semiconductor device of the present invention.

DETAILED DESCRIPTION OF THE INVENTION

Embodiment modes of the present invention will be hereinafter described. Note that the present invention can be carried out in many different modes within a practicable range. It is easily understood by those skilled in the art that the modes and details of the present invention can be changed in various ways without departing from the spirit and the scope of the present invention. Therefore, the present invention should not be interpreted as being limited by the description in the embodiment modes.

Embodiment Mode 1

Figure 1:
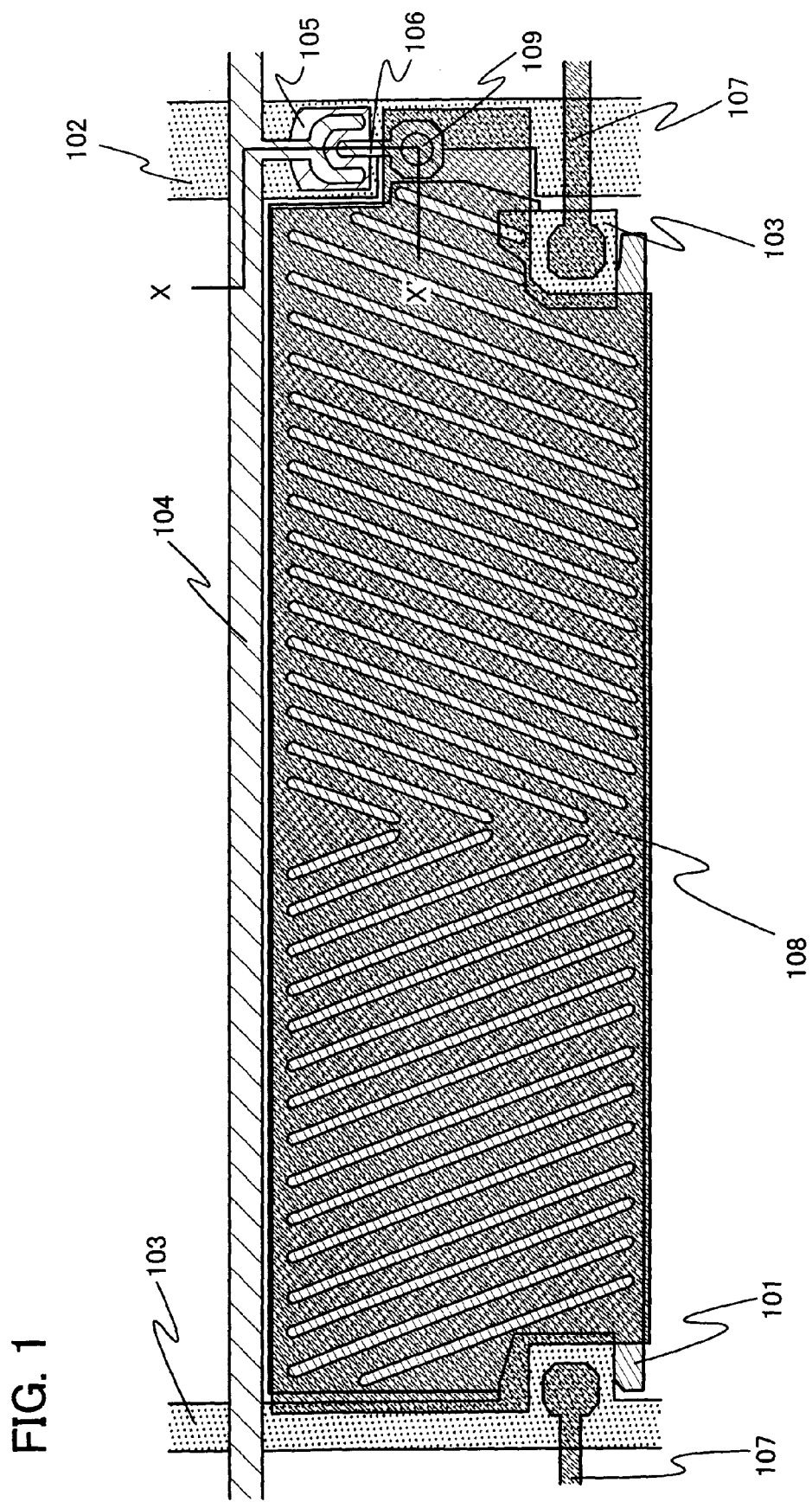
FIG. 1 is a top view illustrating a method for manufacturing a semiconductor device of the present invention.

FIG. 1 is a plan view of an example of an active matrix substrate of an FFS mode LCD which is formed by a method for manufacturing a semiconductor device of the present invention. A structure of one pixel of a plurality of pixels that is arranged in matrix is shown here for simplification.

As shown in FIG. 1, an active matrix substrate has a plurality of common electrodes 101, gate wirings 102, common wirings 103, and source wirings 104 arranged to cross the gate wirings 102 and the common wirings 103, which are disposed over a light-transmitting insulating substrate such as a glass substrate. Over each of the gate wirings, a TFT having an amorphous silicon layer 105 and a drain wiring 106 is formed. The common electrodes of the pixels are connected to each other with wirings 107.

In addition, pixel electrodes 108 are disposed in regions surrounded by the gate wirings 102, the common wirings 103, and the source wirings 104. The TFTs and the pixel electrodes 108 are electrically connected to each other through contact holes 109.

FIGS. 3A to 3D, FIGS. 4A to 4C, FIGS. 5A to 5C, and FIGS. 6A to 6C show a method for manufacturing a TFT portion 300a, a connection terminal portion 300b for a source wiring, and a connection terminal portion 300c for a gate wiring in a pixel portion of an FFS mode active-matrix liquid crystal display device, over a substrate 301 through a four-mask process of the present invention. In the TFT portion 300a, schematic cross-sectional views of a manufacturing process taken along a line X-X' in FIG. 1 are shown; in the connection terminal portion 300b for the source wiring, schematic cross-sectional views of a manufacturing process taken along a line Y-Y' in FIG. 2A; and in the connection terminal portion 300c for the gate wiring, schematic cross-sectional views of a manufacturing process taken along a line Z-Z' in FIG. 2B.

As shown in FIG. 3A, a first transparent conductive film 302 is formed over an entire surface of the substrate 301 by a sputtering method, and a first metal film 303 is stacked over the first transparent conductive film 302 by a sputtering method. For the substrate 301, glass that is conventionally used for manufacture of amorphous silicon TFTs may be used. A preferable material of the first transparent conductive film 302 is indium tin oxide (ITO). The first metal film 303 is used to form a gate electrode and a gate wiring. A preferable material of the first metal film 303 is a low-resistance metal material such as Al, Mo, W, or Ti. Also, the first metal film 303 may have a stacked structure using a high melting point metal such as Mo as a barrier film for a low melting point metal such as Al. With the first metal film having a stacked structure, hillock formation on Al can be suppressed.

Steps to the step of FIG. 3A are carried out successively, for which continuous sputtering can also be performed using a multi-chamber apparatus. Alternatively, it is possible that only the first metal film 303 be formed by a sputtering method using a commercially available glass substrate, an entire surface of which is coated with ITO.

As shown in FIG. 3B, the first transparent conductive film 302 and the first metal film 303 are etched by a wet etching method or a dry etching method with the use of a first photomask which is formed by a photolithography method or the like, thereby shaping the first transparent conductive film 302 into first transparent conductive layers 3021a, 3022a, and 3021c and the first metal film 303 into first metal layers 3031a, 3032a, and 3031c as shown in FIG. 3C. The first transparent conductive layer 3022a serves as a common electrode for FFS mode LCD later. Here, first photoresists 304a and 304c having different thicknesses are formed by a light exposure technique using a half-tone photomask or a gray-tone photomask that is a multi-tone mask as the first photomask. A photoresist in a portion where a pattern of only the first transparent conductive film 302 is formed is thinner than a photoresist in a portion where a stack of the first transparent conductive film 302 and the first metal film 303 is left.

In a conventional process, two photomasks are used for patterning of the first transparent conductive film 302 and the first metal film 303. That is, a first transparent conductive film is formed over an entire surface of a substrate by a sputtering method or the like; a first resist is formed using a first photomask; and the first transparent conductive film is patterned by etching using the first resist. After that, a first metal film is formed over the entire surface of the substrate by a sputtering method or the like; a second resist is formed using a second photomask; and the first metal film is patterned by etching using the second resist.

On the other hand, in the present invention, the first transparent conductive film and the first metal film can be successively formed by a sputtering method or the like, and the first transparent conductive film and the first metal film can be patterned by etching using a multi-tone mask. Therefore, the number of photomasks can be one fewer than that in a conventional process, and the number of photolithography processes each including a resist formation step, a light exposure step, and the like can be one fewer. Thus, an element manufacture process can be simplified.

The distance between the portion where the pattern of only the first transparent conductive film 302 is formed and the portion where the stack of the first transparent conductive film 302 and the first metal film 303 is left is very small. Therefore, it is difficult to perform precise patterning with the use of a conventional photomask. In the case where patterning in such a very small region is required, patterning using a photoresist in the portion where the pattern of only the first transparent conductive film 302 is formed and a photoresist in the portion where the stack of the first transparent conductive film 302 and the first metal film 303 is left, which are formed separately, may cause slight photomask misalignment. However, by use of a multi-tone photomask, photomask misalignment is made less likely to occur and microfabrication is made easier.

As shown in FIG. 3C, deformed first photoresists 305a and 305c are formed by ashing treatment.

As shown in FIG. 3D, the first metal layers 3031a, 3032a, and 3031c are etched by a wet etching method using the deformed first photoresists 305a and 305c, thereby forming a gate electrode 306, a gate wiring 307, and a common electrode 101. Next, the deformed first photoresists 305a and 305c are removed by ashing treatment.

As shown in FIG. 4A, a gate insulating film 406 is formed over the entire surface of the substrate by a plasma CVD method or the like. As a material of the gate insulating film, a silicon nitride film, a silicon oxide film, or a stack thereof is used.

An amorphous silicon film is formed as a first semiconductor film 407 over the gate insulating film 406 by a plasma CVD method or the like. The first semiconductor film 407, in which a channel region is formed later, is a non-doped amorphous silicon film which is not doped with an impurity imparting conductivity.

An n-type amorphous silicon film is formed as a second semiconductor film 408 over the first semiconductor film 407 by a plasma CVD method or the like. The second semiconductor film 408, in which a source region and a drain region are formed later, is an amorphous silicon film ($n^+$ a-Si film) which is doped with phosphorus at high concentration and to which n-type conductivity is imparted.

The gate insulating film 406, the first semiconductor film 407, and the second semiconductor film 408 which are mentioned above can be successively formed with the use of a multi-chamber CVD apparatus.

A second metal film 409 is formed over the second semiconductor film 408 by a sputtering method or the like. A part of the second metal film 409 serves as a source wiring and a drain wiring later. A preferable material of the second metal film 409 is a low-resistance metal such as Al. Also, like the gate electrode, the second metal film 409 may have a stacked structure using a high melting point metal material such as Mo, W, or Ti as a barrier film for a low melting point metal such as Al. With the stacked structure, hillock formation on Al can be suppressed.

As shown in FIG. 4B, second photoresists 410a and 410b are formed in order to pattern the second metal film 409. Here, photoresists having different thicknesses are formed by a light exposure technique using a half-tone photomask or a gray-tone photomask that is a multi-tone mask as a second photomask. The thickness of the resist in a portion where a channel region is formed later is smaller than that of the resist in the other portion.

As shown in FIG. 4C, the second photoresists 410a and 410b are formed using the second photomask; the second metal film 409 is etched by a wet etching method or a dry etching method to form second metal layers 409a and 409b; and the second semiconductor film 408 and the first semiconductor film 407 are etched by a dry etching method to form second semiconductor layers 408a and 408b and first semiconductor layers 407a and 407b.

As shown in FIG. 5A, deformed second photoresists 511a and 511b are formed by ashing treatment of the second photoresists 410a and 410b, thereby exposing the second metal layer 409a. The second metal layer 409a exposed is etched by a dry etching method, and the second semiconductor layer 408a is etched by a wet etching method. Accordingly, second semiconductor layers 4081a and 4082a (a source region and a drain region) and second metal layers 4091a and 4092a (a source wiring and a drain wiring) are formed. It can be considered that the presence of a residue of the second semiconductor layer 408a at this time results in electric current leakage through the residue from the source region to the drain region and also results in malfunction of a TFT. Therefore, in the etching, overetching to the first semiconductor layer 407a is performed so that the second semiconductor layer 408a can be removed completely, thereby forming the channel region. Thus, the first semiconductor layer is preferably formed thick.

In a conventional step of forming the common electrode portion and the channel region, first, the first semiconductor film 407, the second semiconductor film 408, and the second metal film 409 which are stacked over the common electrode are patterned by etching, thereby exposing the gate insulating film over the common electrode. Then, the second semiconductor layer 408a and the second metal layer 409a over the gate electrode are patterned by etching, thereby forming the second semiconductor layers 4081a and 4082a, the second metal layers 4091a and 4092a, and the channel region. That is, in forming the common electrode portion and the channel region, two photomasks are used.

On the other hand, a multi-tone mask is used in the present invention, whereby exposure of a gate insulating film over a common electrode and formation of a channel region can be performed with a single mask. Therefore, the number of photomasks can be one fewer than that in a conventional process, and the number of photolithography processes each including a resist formation step, a light exposure step, and the like can be one fewer. Thus, an element manufacture process can be simplified. In addition, patterning in a very small region is performed for channel formation; thus, by use of a multi-tone mask, photomask misalignment is made less likely to occur and microfabrication is made easier.

As shown in FIG. 5B, the deformed second photoresists 511a and 511b are removed, and a protective film 512 is formed over the entire surface of the substrate by a plasma CVD method or the like. A preferable material of the protective film 512 is silicon nitride or the like.

In a conventional amorphous silicon TFT, entry of alkali metal such as Na or the like into a semiconductor layer from a glass substrate side or entry of contaminant from a liquid crystal side may cause deterioration of TFT characteristics or malfunction, which leads to a decrease in element reliability. Therefore, an amorphous silicon layer is covered with a silicon nitride film. Even when an amorphous silicon TFT is manufactured by using the present invention, an amorphous silicon layer can be covered with a silicon nitride film. In the present invention, the silicon nitride film also functions as a protective film to prevent contaminant from entering a channel portion. Thus, reliability is improved.

As shown in FIG. 5C, third photoresists 513a, 513b, and 513c are formed using a third photomask, and the protective film 512 is etched by a dry etching method using the third photoresists 513a, 513b, and 513c. By etching the protective film 512, the second metal layer 4092a is exposed in the TFT portion 300a, and a contact hole for a pixel electrode is formed. In the connection terminal portion 300b for the source wiring, the second metal layer 409b is exposed. The second metal layer 409b exposed serves as a connection terminal and is electrically connected to a flexible printed circuit (FPC) or the like with a conductive adhesive such as an anisotropic conductive film (ACF). In the connection terminal portion 300c for the gate wiring, the gate insulating film 406 is etched by a dry etching method, thereby exposing the first metal layer 3031c. The first metal layer 3031c exposed serves as a connection terminal.

As shown in FIG. 6A, the third photoresists 513a, 513b, and 513c are removed by ashing treatment, and a second transparent conductive film 614 is formed over the entire surface of the substrate by a sputtering method or the like. A preferable material of the second transparent conductive film 614 is ITO.

As shown in FIG. 6B, fourth photoresists 615a, 615b, and 615c are formed using a fourth photomask, and the second transparent conductive film 614 is etched by a wet etching method using the fourth photoresists 615a, 615b, and 615c, thereby forming a plurality of slits.

As shown in FIG. 6C, the fourth photoresists 615a, 615b, and 615c are removed by ashing treatment. An exposed second transparent conductive layer 6141a and 6142a serves as a pixel electrode, and exposed second transparent conductive layers 614b and 614c each serve as a transparent electrode.

Figure 2B:
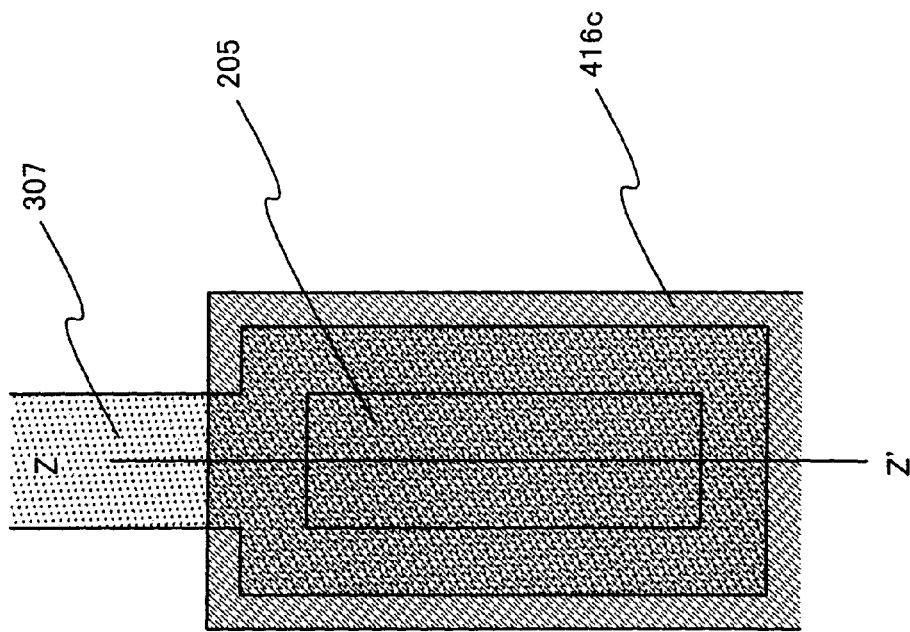
FIGS. 2A and 2B are top views illustrating a method for manufacturing a semiconductor device of the present invention.
Figure 2A:
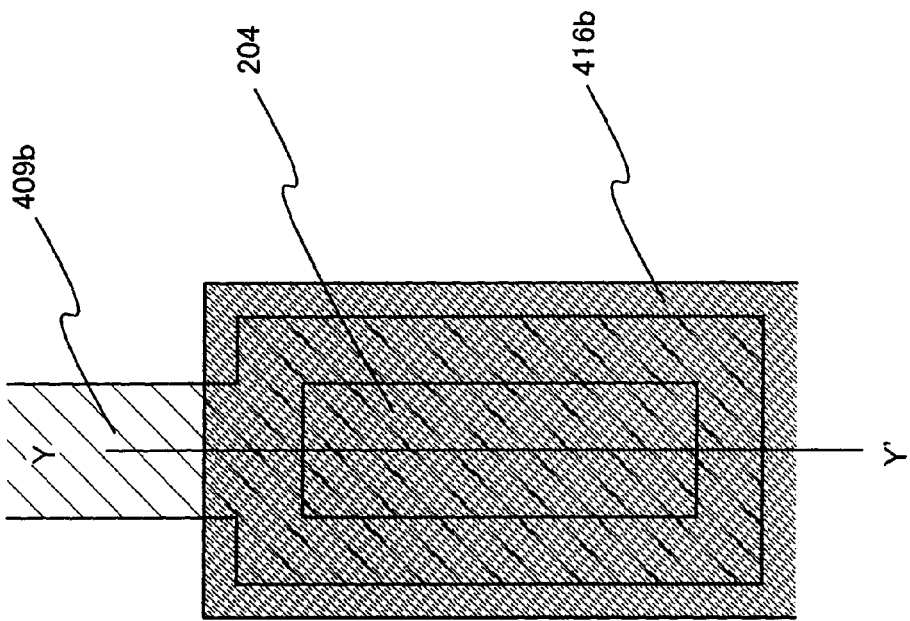

FIGS. 2A and 2B are top views, where the cross sections in FIGS. 3A to 3D, FIGS. 4A to 4C, FIGS. 5A to 5C, and FIGS. 6A to 6C are taken along the lines Y-Y' and Z-Z'. FIGS. 2A and 2B show connection terminal portions 200a and 200b which are electrically connected to an FPC. Note that the protective film 512 and the like are omitted in FIGS. 2A and 2B. In the connection terminal portion 200a for a source wiring, a transparent electrode 416b is disposed over the source wiring 409b which is the second metal layer. The source wiring 409b and the transparent electrode 416b are electrically connected to each other through a contact hole 204. In the connection terminal portion 200b for a gate wiring, a transparent electrode 416c is disposed over a gate wiring 307. The gate wiring 307 and the transparent electrode 416c are electrically connected to each other through a contact hole 205.

Embodiment Mode 2

Figure 7:
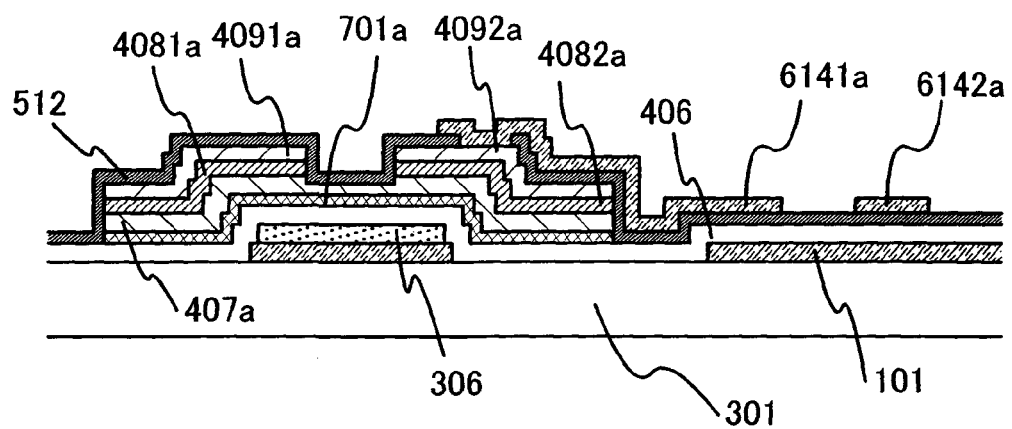
FIG. 7 is a cross-sectional view illustrating a method for manufacturing a semiconductor device of the present invention.

In this embodiment mode, an example in which a microcrystalline silicon film is used as a thin film that functions as a channel formation region of a TFT is described with reference to a TFT cross-sectional view shown in FIG. 7. Note that portions corresponding to those in FIGS. 3A to 3D, FIGS. 4A to 4C, FIGS. 5A to 5C, and FIGS. 6A to 6C are described using the same reference numerals.

A microcrystalline silicon film can be formed by a high-frequency plasma CVD method with a frequency of several tens to several hundreds of megahertz or a microwave plasma CVD method with a frequency of 1 GHz or more. A microcrystalline silicon film can be typically formed using silicon hydride, such as $SiH_4$ or $Si_2H_6$, which is diluted with hydrogen. Note that, in place of silicon hydride, $SiH_2Cl_2$, $SiHCl_3$, $SiCl_4$, $SiF_4$, or the like can be used.

In accordance with Embodiment Mode 1, a first transparent conductive film and a first metal film are formed over an entire surface of a substrate and are patterned using a multi-tone mask as a first photomask.

A gate insulating film, a third semiconductor film, a first semiconductor film, a second semiconductor film, and a second metal film are stacked in this order over the entire surface of the substrate. A microcrystalline silicon film, an amorphous silicon film, and an n-type amorphous silicon film ($n^+$ a-Si film) can be used as the third semiconductor film, the first semiconductor film, and the second semiconductor film, respectively. Note that the gate insulating film, the third semiconductor film, the first semiconductor film, and the second semiconductor film can be formed successively. The first semiconductor film is used in order to prevent the third semiconductor film from being oxidized. Next, as shown in FIG. 4B, a second photoresist 410a is formed over the second metal film by using a second photomask which is a multi-tone mask. Then, as shown in FIG. 4C, etching is performed using the second photoresist 410a, thereby forming a third semiconductor layer 701a, a first semiconductor layer 407a, a second semiconductor layer 408a, and a second metal layer 409a.

Furthermore, as shown in FIG. 5A, etching is performed using a deformed second photoresist 511a which is obtained by ashing the second photoresist 410a, thereby forming second metal layers 4091a and 4092a and second semiconductor layers 4081a and 4082a. At this time, overetching is performed so that a residue of the second semiconductor layer 408a is not left.

After that, in accordance with Embodiment Mode 1, a protective film 512 is formed over the entire surface of the substrate and is patterned using a third photomask. A second transparent conductive film 614 is formed over the entire surface of the substrate and is patterned using a fourth photomask. Note that the gate insulating film, the first transparent conductive film, the second transparent conductive film, the first metal film, the second metal film, and the protective film of this embodiment mode can be formed using the materials described in Embodiment Mode 1.

By use of the third semiconductor film, a TFT having higher mobility than a TFT using only the first semiconductor film can be manufactured.

Embodiment Mode 3

Examples of electronic devices that can be manufactured by using a method for manufacturing a semiconductor device of the present invention are as follows: televisions; cameras such as video cameras and digital cameras; goggle-type displays (head-mounted displays); navigation systems; sound reproduction devices (such as car audio systems, audio components); notebook personal computers; game machines; portable information terminals (such as mobile computers, cellular phones, portable game machines, and electronic book readers); image reproduction devices each provided with a recording medium (specifically, devices each having a display that can reproduce a recording medium such as a digital versatile disc (DVD) and can display the images); and the like. FIGS. 8A to 8D and FIG. 9 show specific examples of these electronic devices.

Figure 8A:
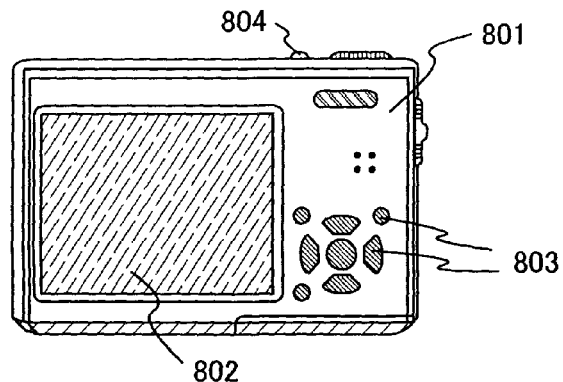
FIGS. 8A to 8D are diagrams of products each using a semiconductor device that is manufactured by implementing the present invention.

FIG. 8A shows a digital camera, which includes a main body 801, a display portion 802, an imaging portion, operation keys 803, a shutter button 804, and the like. Note that FIG. 8A shows the digital camera seen from the display portion 802 side, and the imaging portion is not shown in FIG. 8A. In accordance with the present invention, a more inexpensive and highly reliable digital camera can be realized.

Figure 8B:
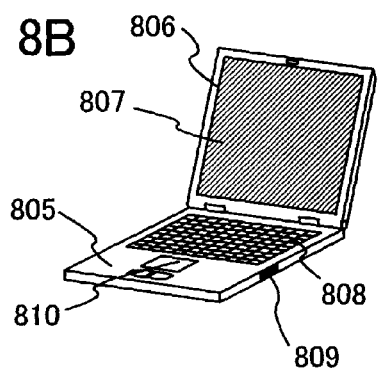

FIG. 8B shows a notebook personal computer, which includes a main body 805, a housing 806, a display portion 807, a keyboard 808, an external connection port 809, a pointing device 810, and the like. In accordance with the present invention, a more inexpensive and highly reliable notebook personal computer can be realized.

Figure 8C:
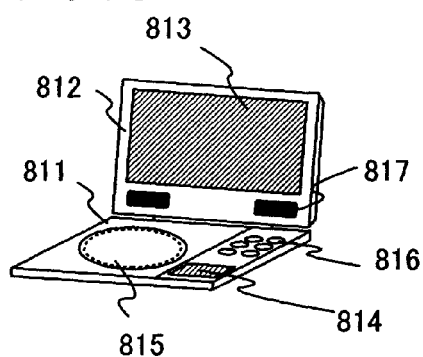

FIG. 8C shows a portable image reproduction device provided with a recording medium (specifically, a DVD reproduction device), which includes a main body 811, a housing 812, a first display portion 813, a second display portion 814, a recording media (DVD and the like) reading portion 815, operation keys 816, a speaker portion 817, and the like. The first display portion 813 mainly displays image information while the second display portion 814 mainly displays text information. Note that examples of the image reproduction device provided with the recording medium also include home vide game machines and the like. In accordance with the present invention, a more inexpensive and highly reliable image reproduction device can be realized.

Figure 8D:
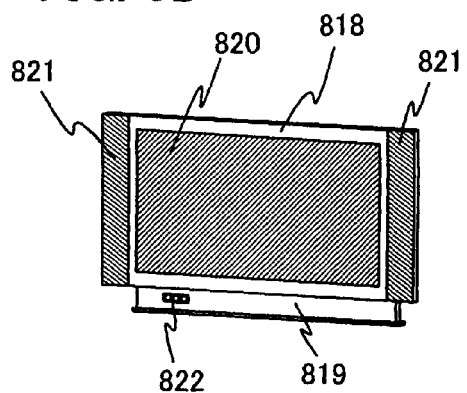

FIG. 8D shows a display device, which includes a housing 818, a support 819, a display portion 820, speakers 821, video input terminals 822, and the like. This display device is manufactured using TFTs formed by the manufacturing method described above in the embodiment modes in the display portion 820 and a driver circuit. Note that examples of the display device include liquid crystal display devices, light emitting devices, and the like and the display device specifically includes all types of display devices for displaying information, such as display devices for computers, display devices for receiving television broadcast, and display devices for advertisement. In accordance with the present invention, a more inexpensive and highly reliable display device can be realized.

Figure 9:
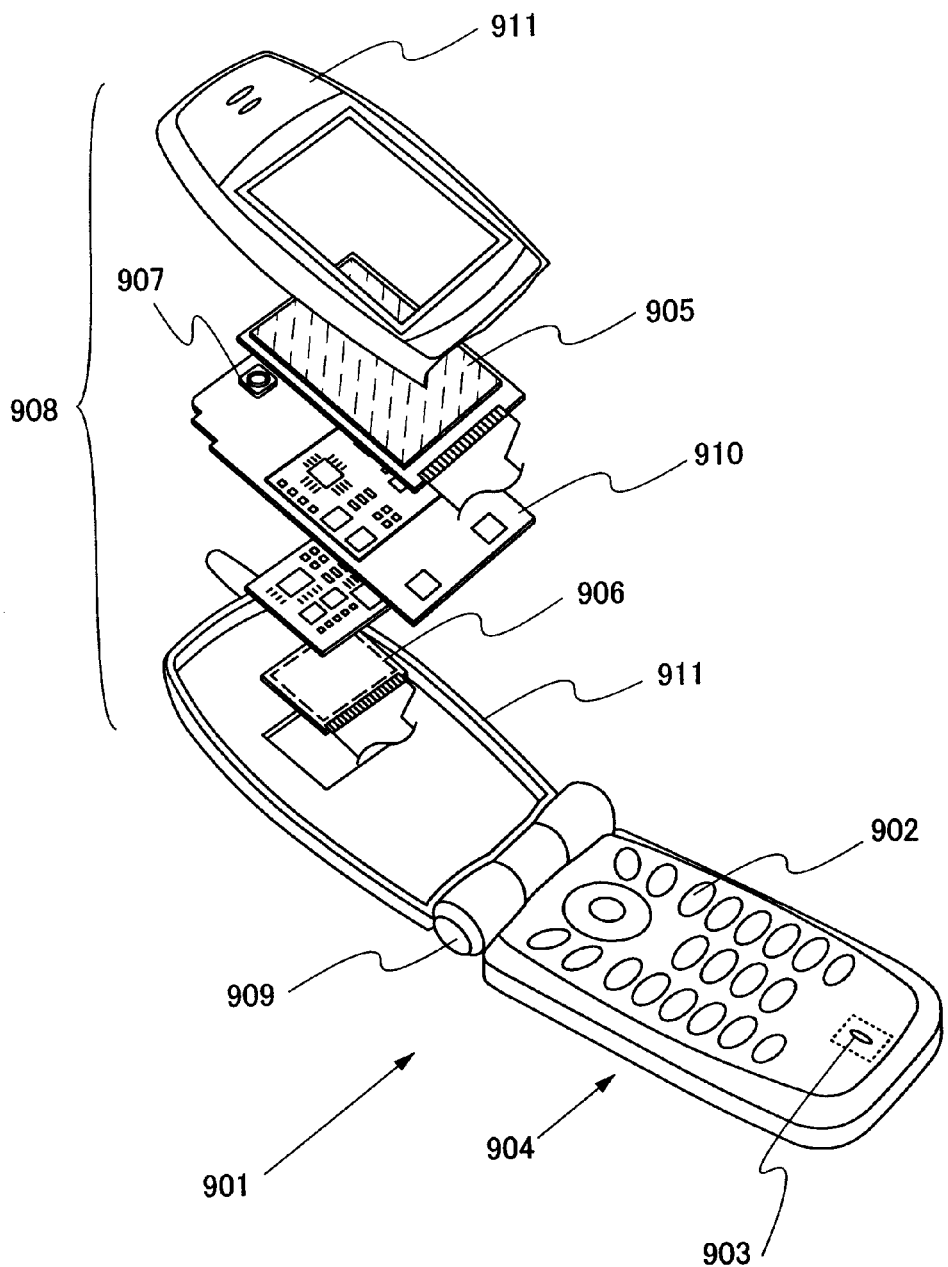
FIG. 9 is a diagram of a product using a semiconductor device that is manufactured by implementing the present invention.

FIG. 9 shows a cellular phone 901, in which a main body (A) 904 including operation switches 902, a microphone 903, and the like is connected with a hinge 909 to a main body (B) 908 including a display panel (A) 905, a display panel (B) 906, a speaker 907, and the like so as to be openable and closable. The display panel (A) 905 and the display panel (B) 906 are disposed in a housing 911 of the main body (B) 908 together with a circuit board 910. Pixel portions of the display panel (A) 905 and the display panel (B) 908 are placed so as to be visible through open windows that are formed in the housing 911.

As for the display panel (A) 905 and the display panel (B) 908, the specification such as the number of pixels can be appropriately set in accordance with the functions of the cellular phone 901. For example, the display panel (A) 905 and the display panel (B) 906 can be combined as a main screen and a sub-screen, respectively. In accordance with the present invention, a more inexpensive and highly reliable portable information terminal can be realized.

The cellular phone 901 of this embodiment mode can be modified in various modes in accordance with the functions and the applications thereof. For example, the cellular phone 901 may be a camera-equipped cellular phone in which an imaging element is incorporated in the hinge 909. In addition, even when the operation switches 902, the display panel (A) 905, and the display panel (B) 906 are disposed in one housing, the above-described effect can be obtained. Furthermore, a similar effect can be obtained when the structure of this embodiment mode is applied to an information display terminal having a plurality of display portions.

As described above, a variety of electronic devices can be completed using the manufacturing methods of Embodiment Modes 1 and 2 of the present invention.

This application is based on Japanese Patent Application serial no. 2007-312900 filed with Japan Patent Office on Dec. 3, 2007, the entire contents of which are hereby incorporated by reference.

What is claimed is:

1. A method for manufacturing a semiconductor device, comprising the steps of:
    forming a transparent conductive film and a first metal film sequentially over a substrate;
    forming a first resist by using a first photomask which is a multi-tone mask, the first resist having different thicknesses in a first portion and in a second portion;
    forming a gate electrode by shaping the transparent conductive film and the first metal film with the first resist so that a stack of the transparent conductive film and the first metal film remains in the first portion and only the transparent conductive film remains in the second portion;
    forming an insulating film, a first semiconductor film, a second semiconductor film, and a second metal film sequentially over the gate electrode;
    forming a second resist by using a second photomask which is a multi-tone mask, the second resist having different thicknesses in a channel region formation portion and in a source region formation portion and a drain region formation portion;
    forming a first semiconductor layer, a second semiconductor layer, and a second metal layer by shaping the first semiconductor film, the second semiconductor film, and the second metal film, respectively, with the second resist;
    forming a channel region, a drain region, a source region, a drain wiring, and a source wiring of a thin film transistor by etching a part of the first semiconductor layer, the second semiconductor layer, and the second metal layer in the channel region formation portion;
    forming a protective film over the thin film transistor; and
    forming a pixel electrode over the protective film.

2. The method for manufacturing a semiconductor device according to claim 1, wherein the first semiconductor film is a non-doped amorphous silicon film which is not doped with an impurity imparting conductivity.

3. The method for manufacturing a semiconductor device according to claim 1, wherein the second semiconductor film is an n-type amorphous silicon film.

4. The method for manufacturing a semiconductor device according to claim 1, wherein the multi-tone masks are one of a half-tone photomask and a gray-tone photomask.

5. The method for manufacturing a semiconductor device according to claim 1, wherein the pixel electrode is provided with a plurality of slits in the step of forming the pixel electrode.

6. The method for manufacturing a semiconductor device according to claim 1, wherein the semiconductor device is a fringe field switching mode liquid crystal display.

7. The method for manufacturing a semiconductor device according to claim 1, wherein the substrate is a light-transmitting insulating substrate.

8. The method for manufacturing a semiconductor device according to claim 1, wherein a common electrode comprising the transparent conductive film is formed in the step of forming the gate electrode.

9. The method for manufacturing a semiconductor device according to claim 1, wherein the first metal film has a stacked structure.

10. The method for manufacturing a semiconductor device according to claim 1, wherein the second metal film has a stacked structure.

11. The method for manufacturing a semiconductor device according to claim 1, wherein a part of the first semiconductor layer in the channel region formation portion is etched in the step of forming the channel region, the source region, the drain region, the source wiring, and the drain wiring of the thin film transistor.

12. A method for manufacturing a semiconductor device, comprising the steps of:
    forming a first transparent conductive film and a first metal film sequentially over a substrate;
    forming a first resist by using a first photomask which is a multi-tone mask, the first resist having different thicknesses in a first portion and in a second portion;
    forming a gate electrode by shaping the first transparent conductive film and the first metal film with the first resist so that a stack of the first transparent conductive film and the first metal film remains in the first portion and only the first transparent conductive film remains in the second portion;
    forming an insulating film over the gate electrode;
    forming a third semiconductor film over the insulating film;
    forming a first semiconductor film, a second semiconductor film, and a second metal film sequentially over the third semiconductor film;
    forming a second resist by using a second photomask which is a multi-tone mask, the second resist having different thicknesses in a channel region formation portion and in a source region formation portion and a drain region formation portion;
    forming a third semiconductor layer, a first semiconductor layer, a second semiconductor layer, and a second metal layer by shaping the third semiconductor film, the first semiconductor film, the second semiconductor film, and the second metal film, respectively, with the second resist;

ashing the second resist to form a third resist;

forming a channel region, a source region, a drain region, a source wiring, and a drain wiring of a thin film transistor by etching the third semiconductor layer, the first semiconductor layer, the second semiconductor layer, and the second metal layer with the third resist;

forming a protective film over the thin film transistor;

forming a fourth resist in a region so as not to cover a contact hole formation portion by using a third photomask;

forming a contact hole in the protective film by shaping the protective film with the fourth resist;

forming a second transparent conductive film over the protective film;

forming a fifth resist in a pixel electrode formation portion by using a fourth photomask; and forming a pixel electrode by shaping the second transparent conductive film with the fifth resist.

13. The method for manufacturing a semiconductor device according to claim 12, wherein the first semiconductor film is a non-doped amorphous silicon film which is not doped with an impurity imparting conductivity.

14. The method for manufacturing a semiconductor device according to claim 12, wherein the second semiconductor film is an n-type amorphous silicon film.

15. The method for manufacturing a semiconductor device according to claim 12, wherein the multi-tone masks are one of a half-tone photomask and a gray-tone photomask.

16. The method for manufacturing a semiconductor device according to claim 12, wherein the pixel electrode is provided with a plurality of slits in the step of forming the pixel electrode by shaping the second transparent conductive film.

17. The method for manufacturing a semiconductor device according to claim 12, wherein the semiconductor device is a fringe field switching mode liquid crystal display.

18. The method for manufacturing a semiconductor device according to claim 12, wherein the substrate is a light-transmitting insulating substrate.

19. The method for manufacturing a semiconductor device according to claim 12, wherein a common electrode comprising the first transparent conductive film is formed in the step of forming the gate electrode.

20. The method for manufacturing a semiconductor device according to claim 12, wherein the first metal film has a stacked structure.

21. The method for manufacturing a semiconductor device according to claim 12, wherein the second metal film has a stacked structure.

22. The method for manufacturing a semiconductor device according to claim 12, wherein a part of the first semiconductor layer in the channel region formation portion is etched in the step of forming the channel region, the source region, the drain region, the source wiring, and the drain wiring of the thin film transistor.

23. The method for manufacturing a semiconductor device according to claim 12, wherein the third semiconductor film is formed by microwave plasma CVD with a frequency of greater than or equal to 1 GHz.

24. A method for manufacturing a semiconductor device, comprising the steps of:

forming a gate electrode;

forming an insulating film over the gate electrode;

forming a third semiconductor film over the insulating film;

forming a first semiconductor film, a second semiconductor film, and a metal film sequentially over the third semiconductor film;

forming a resist by using a photomask which is a multi-tone mask, the resist having different thicknesses in a channel region formation portion and in a source region formation portion and a drain region formation portion;

forming a third semiconductor layer, a first semiconductor layer, a second semiconductor layer, and a metal layer by shaping the third semiconductor film, the first semiconductor film, the second semiconductor film, and the metal film, respectively, with the resist; and forming a channel region, a source region, a drain region, a source wiring, and a drain wiring of a thin film transistor by etching the third semiconductor layer, the first semiconductor layer, the second semiconductor layer, and the metal layer.

25. The method for manufacturing a semiconductor device according to claim 24, wherein the first semiconductor film is a non-doped amorphous silicon film which is not doped with an impurity imparting conductivity.

26. The method for manufacturing a semiconductor device according to claim 24, wherein the second semiconductor film is an n-type amorphous silicon film.

27. The method for manufacturing a semiconductor device according to claim 24, wherein the multi-tone mask is one of a half-tone photomask and a gray-tone photomask.

28. The method for manufacturing a semiconductor device according to claim 24, wherein the semiconductor device is a fringe field switching mode liquid crystal display.

29. The method for manufacturing a semiconductor device according to claim 24, wherein the metal film has a stacked structure.

30. The method for manufacturing a semiconductor device according to claim 24, wherein a part of the first semiconductor layer in the channel region formation portion is etched in the step of forming the channel region, the source region, the drain region, the source wiring, and the drain wiring of the thin film transistor.

31. The method for manufacturing a semiconductor device according to claim 24, wherein the third semiconductor film is formed by microwave plasma CVD with a frequency of greater than or equal to 1 GHz.

* * * * *